United States Patent [19]
Nakanishi et al.

[11] Patent Number: 5,539,767
[45] Date of Patent: Jul. 23, 1996

[54] SEMICONDUCTOR LASER DEVICE

[75] Inventors: Hideyuki Nakanishi, Kyoto; Akira Ueno, Katano; Hideo Nagai, Takatsuki; Akio Yoshikawa, Ibaraki, all of Japan

[73] Assignee: Matsushia Electronics Corporation, Osaka, Japan

[21] Appl. No.: 253,915

[22] Filed: Jun. 3, 1994

[30] Foreign Application Priority Data

Jun. 4, 1993 [JP] Japan ................................. 5-134506

[51] Int. Cl.$^6$ ............................... H01S 3/00; H01S 3/19; H01L 23/06
[52] U.S. Cl. ............................ 372/109; 372/36; 257/659
[58] Field of Search ........................... 372/36, 108, 109; 385/14; 257/632, 659

[56] References Cited

U.S. PATENT DOCUMENTS

| | | | |
|---|---|---|---|
| 5,051,815 | 9/1991 | Hidaka | 257/659 |
| 5,294,826 | 3/1994 | Marcantonio et al. | 257/659 |
| 5,327,443 | 7/1994 | Tanaka et al. | 372/36 |
| 5,367,593 | 11/1994 | Lebby et al. | 385/14 |
| 5,406,117 | 4/1995 | Dlugokecki et al. | 257/659 |
| 5,422,900 | 6/1995 | Reele et al. | 372/29 |

*Primary Examiner*—James W. Davie
*Attorney, Agent, or Firm*—Willian Brinks Hofer Gilson & Lione

[57] ABSTRACT

The present invention relates to a semiconductor laser device on which a high-frequency signal can be superposed without radiating said high-frequency signal externally. Said device consists of a semiconductor laser element mounted directly or indirectly through a semiconductor substrate on a comb-frame, and an outer frame made of an insulation material provided at an area surrounding said comb-frame on which said semiconductor laser chip is mounted; and this device is fixed on a printed circuit board with a through-hole allowing a direct pass of laser light emitted from said semiconductor laser device. Said printed circuit board is provided with a high-frequency circuit and is lined with a metal film layer on the rear surface of said printed circuit board or within said printed circuit board.

5 Claims, 4 Drawing Sheets

SEMICONDUCTOR LASER DEVICE

FIELD OF THE INVENTION

This invention relates to a semiconductor laser device applicable to optical information processors, optical analyzers, optical communication equipments, etc.

BACKGROUND OF THE INVENTION

As an optical pickup to be used to write and read information signals on or from opto-magnetic disk, phase-transition type optical disk, or other optical media, a high-power semiconductor laser device capable of delivering stable and high optical output power without producing interference between the light reflected from optical medium and the light introduced thereon, has ben strongly desired.

However, since the high-power single mode laser device is inevitably unstable particularly when it is in a read condition delivering a minute optical power output, and the light reflected from the optical medium is inputted therein. In order to improve this unstable condition, the semiconductor laser device has been conventionally driven by current on which high-frequency current of an order of several hundred mega Hertz is superposed. By this, a multi-mode oscillation spectrum can be obtained, and the laser stability against the reflected light can be substantially improved.

A schematic construction of such conventional semiconductor laser device is shown in FIG. 2 wherein 1 is a semiconductor laser chip, 2 is a package stem in which said semiconductor laser chip is mounted, 3 is a glass window delivering the optical output of said semiconductor laser device, 4 is a printed circuit board on which a high-frequency circuit is disposed, 5 is an electronic elements constituting said high-frequency circuit, and 6 is a package in which said high-frequency circuit is provided.

In accordance to the development of compact optical disk, the development of more compact optical pickup has been strongly desired, and for this, an optical unit in which the components of optical pickup are integrated, has been proposed.

An example of the proposed unit is shown in FIG. 3 wherein 7 is a silicon substrate, 8 is a mirror inclined at an angle of 45°, 9 is a photo-detector detecting optical signals, 10 is a frame made of resin, 11 is a comb-frame, 12 is a hologram element, 13 is an outputted laser light, and 14 is a light modulated at the surface of optical disk and reflected to the laser device.

The construction of the proposed unit is explained below by referring FIG. 3 wherein semiconductor laser chip 1 is disposed on silicon substrate 7, and outgoing laser light 13 is directed along a direction vertical to said substrate after it is reflected by said mirror inclined at an angle of 45°.

Said outputted laser light 13 is introduced on an objective lens through a collimator lens provided at a side of said pickup, before said light 13 is focused on an optical disk. The light is modulated thereon, and is reflected from the surface of said optical disk, and is returned to said optical unit. At this time, a part of the modulated light is refracted by hologram element 12 and the refracted light is detected by photo-detector 9 fabricated on silicon substrate 7.

Although FIG. 3 shows a typical optical unit in which various optical functions are integrated, the method to superpose the high-frequency signal on the injection current of semiconductor laser device had not been well refined. Therefore, when this optical unit is utilized as an optical pickup, and when the light reflected from an optical disk is detected by a photo-detector, the output of the photo-detector is unstable, and readout signals containing a large amount of noise are generated.

Thus, similar to the construction of conventional semiconductor laser device shown in FIG. 2, a device construction wherein the high-frequency circuit elements are directly disposed on the terminals of semiconductor laser device, has been considered. A typical device construction of such is shown in FIGS. 4(a) and 4(b) wherein the high-frequency signal is applied to the semiconductor laser through the terminals of comb-frame 11.

In this case, in order to prevent the radiation of high-frequency signal from the electrode terminals, the conventional semiconductor laser device including its terminals shown in FIG. 2 have to be sealed in metal package stem 2, and the high frequency circuit has to be sealed in metal package 6, and these two metal packages have to be bonded and grounded.

Furthermore, with the device construction shown in FIGS. 4(a) and 4(b), package stem 2 of semiconductor laser device is not completely shielded, and therefore, the high-frequency radiation from the termi-nals and its interaction with the other circuits are inevitable. Moreover, because of the excessive device thickness especially along its optical axis, most of the advantages of the optical device integration would be lost.

SUMMARY OF THE INVENTION

The object of the present invention is to offer a semiconductor laser device of thin construction, particularly, along its optical axial direction. By taking his construction, the high-frequency signal can be superposed easily without external radiation causing ill-effects on the peripheral circuits, and this is highly useful to construct a compact and thin optical pickup.

The invented semiconductor laser device consists of a semiconductor laser unit comprised of a semiconductor laser chip mounted directly or indirectly on a comb-frame using a semiconductor substrate in-between and an outer frame made of an insulation material surrounding said comb-frame, and a printed circuit board on which said semiconductor laser unit is mounted, provided with a through-hole allowing the pass of the laser light emitted from the semiconductor laser device, and a high-frequency circuit disposed on it, and a metal film provided on its rear surface or within said printed circuit board.

The semiconductor substrate is also provided with a mirror inclined at an angle of 45° in order to reflect the laser light outputted from the semiconductor laser chip into a vertical direction. The semiconductor laser device is also integrated with either a photo-detector or an electric circuit on its surface. Moreover, the invented semiconductor laser device is provided with at least a circuit to superpose a high-frequency signal onto the semiconductor laser device, a circuit to drive the semiconductor laser device, and a circuit to process the signal outputted from said photo detector which is integrated with the semiconductor laser device, or a circuit to protect the semiconductor laser device against surge.

Therefore, according to the invented device construction, a high-frequency signal can be superposed on the semiconductor laser device without causing external radiation. Moreover, the size of the semiconductor laser device, particularly the device thickness along its optical axis can be minimized to an order of the thickness of optical unit such as an optical pickup.

Therefore, the output power can be stabilized by superposing a high-frequency signal on the semiconductor laser device without radiating a high-frequency signal externally, in addition to the compact and thin device construction realized by the integrating of the optical elements.

DESCRIPTION OF PREFERRED EMBODIMENTS

Figure 1:
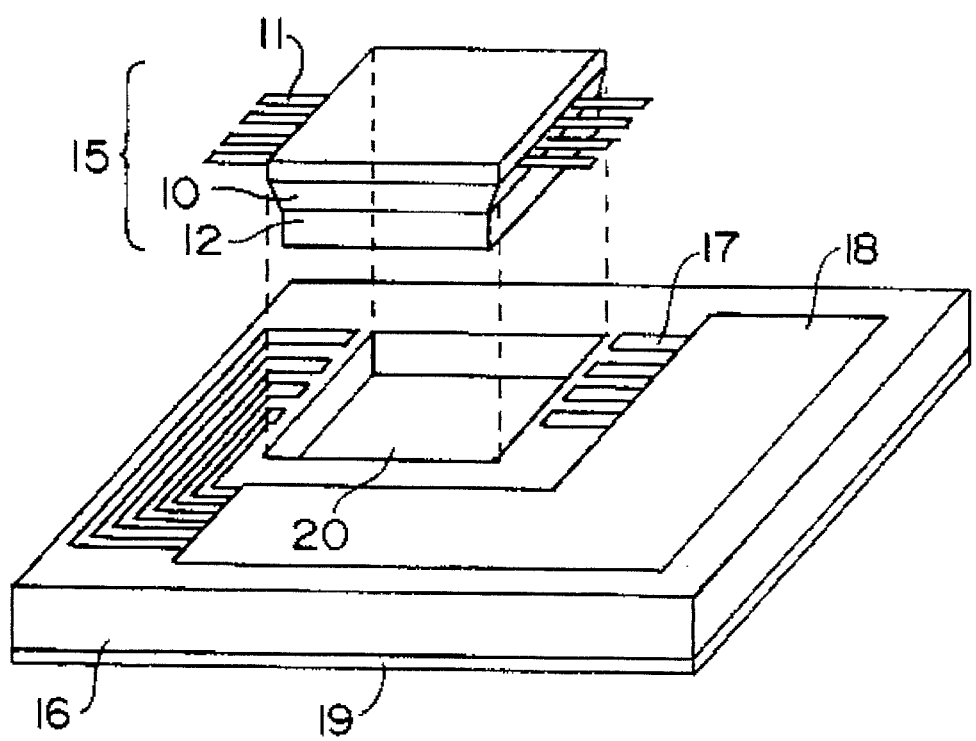
FIG. 1 is an exploded perspective view of semiconductor laser device which is an embodiment of the invention.
Figure 2:
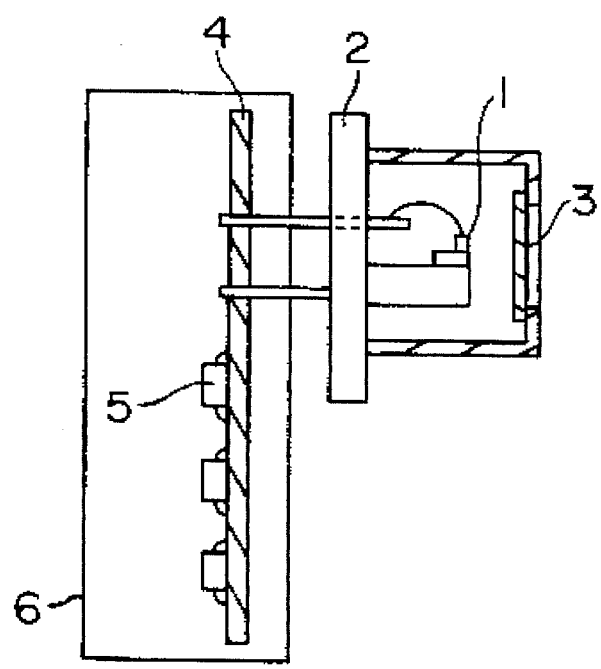
FIG. 2 is a cross-section of conventional semiconductor laser device.
Figure 3:
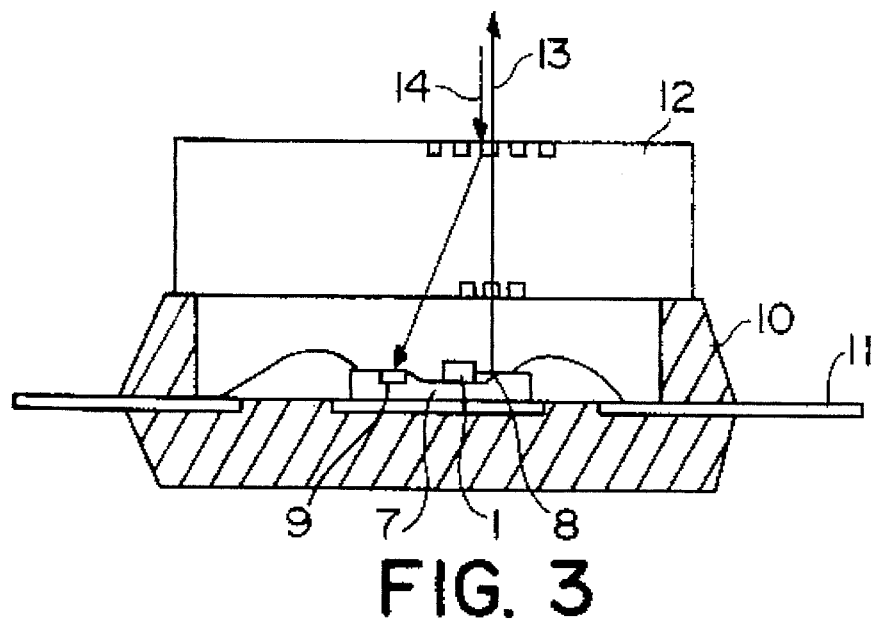
FIG. 3 is another cross-section of conventional optical unit.

A semiconductor laser device which is an embodiment of the invention is now explained by referring FIG. 1, wherein 15 is an optical unit of which structure is shown in FIG. 3, 16 is a printed circuit board, 17 is an electrode pad, 18 is a circuit disposed on said printed circuit board 16, 19 is metal film, and 20 is a through-hole provided within printed circuit board 16.

A circuit to superpose a high-frequency signal to the semiconductor laser device incorporated within optical unit 15 is provided within a region of circuit 18 formed on printed circuit board 16. In order to apply the high-frequency signal to optical unit 15, electrode terminals 11 made of a comb-frame of optical unit 15 are disposed at the positions each corresponding to electrode pads 17 provided on printed circuit board 16, and electrode terminals 17 and corresponding electrode pads 17 are soldered and fixed.

At this time, a part of hologram optical element 12 of optical unit 15 is inserted in through-hole 20 provided in printed circuit board 16, so that the laser light emitted from the semiconductor laser chip is radiated toward a desired direction passing through-hole 20. Furthermore, metal film 19 is provided on the rear surface of printed circuit board 16.

By employing the presently shown device construction, the light emitted from optical unit 15 can be radiated only by passing through-hole 20 provided within printed circuit board 16, allowing no light radiation toward the upper part of printed circuit board 16. Therefore, the leakage of high-frequency signal from printed circuit board 16 is shielded completely by grounding metal film 19 provided over the rear surface of printed circuit board 16 and metal cover 21 which is placed over printed circuit board 16 as shown in FIG. 5.

Figure 5:
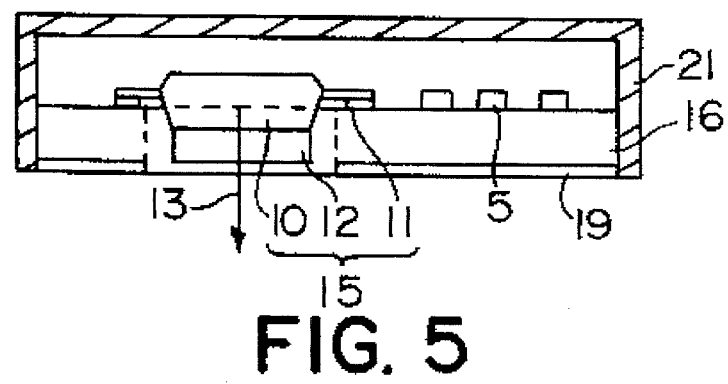
FIG. 5 is a cross-section of semiconductor laser device which is an embodiment of the invention.

Since the outer frame 10 of optical unit 15 and hologram element 12 shown in FIG. 1 are housed within through-hole 20 provided within printed circuit board 16 as shown in FIG. 5, the thicknesses of the semiconductor laser device it self can be made nearly equal to that of the optical unit by employing thin metal cover 21.

Figure 6:
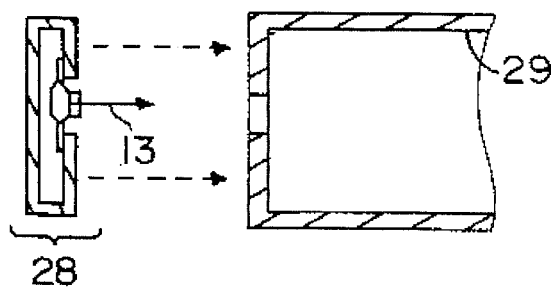
FIG. 6 is a structure of optical pick-up incorporating a semiconductor laser device which is an embodiment of the invention.

FIG. 6 shows a conceptional drawing of the construction of optical pick-up incorporating the semiconductor laser device which is an embodiment of the invention. In FIG. 6, 28 is an invented semiconductor laser device, 29 is a part of the frame of optical pickup. As shown in the drawing of optical pickup, the output surface of semiconductor laser device is generally disposed to make a close contact with the frame of optical pickup.

Since semiconductor laser device 28 consists of a semiconductor laser element, photo-detector, and other electronic circuits, these optical components have to be assembled into an optical pickup with a utmost precision. Moreover, the direction of output light 13 has to be aligned at an error less than ±30 µ throughout the reference plane to the light output point.

Figure 4A:
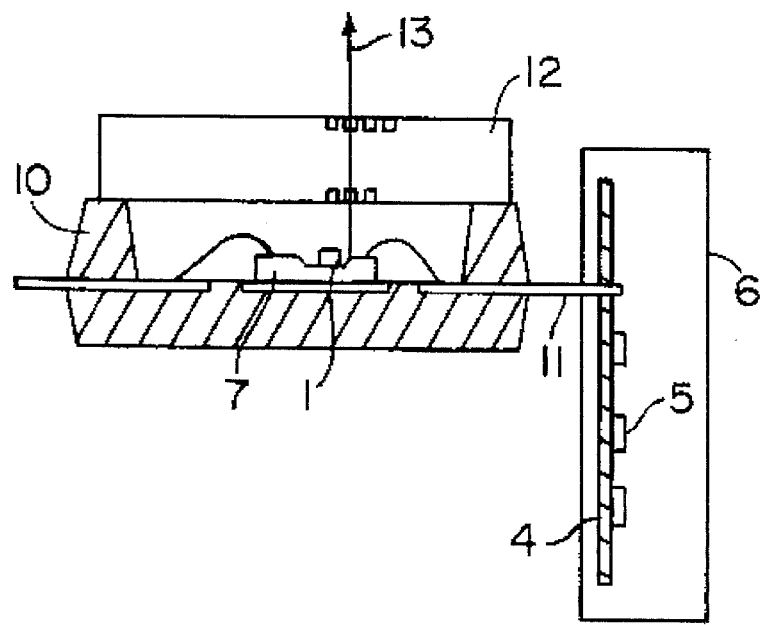
FIGS. 4(a) and 4(b) show respectively a cross-section of conventional optical unit provided with a high-frequency circuit.
Figure 4B:
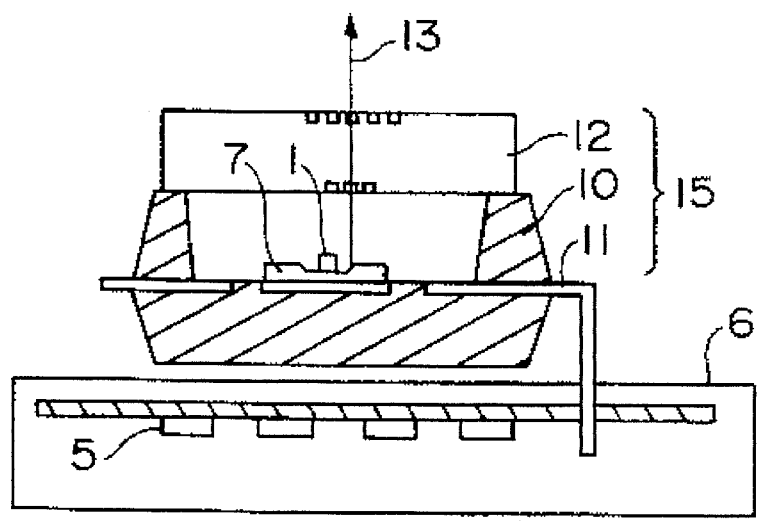

If a package incorporating optical unit 15 mounted on a printed circuit board provided with a through-hole from which output light 13 is emitted, were assembled by employing a conventional device structure in FIG. 4(b), the possible error in the distance from optical unit 15 to the package, would be a total of package machining error of ±50 µm, package mounting error of ±30 µm, and optical unit mounting error of ±10 µm, that is, ±90 µm in total, and therefore, the unit can not be assembled at a required precision.

However, by employing the above-described construction of the invention, the possible total error would be less than the sum of an thickness error in the printed circuit board of ±10 µm, an optical unit mounting error of ±10 µm, and an height error of optical unit of ±10 µm, i.e., less than ±30 µm.

Figure 7:
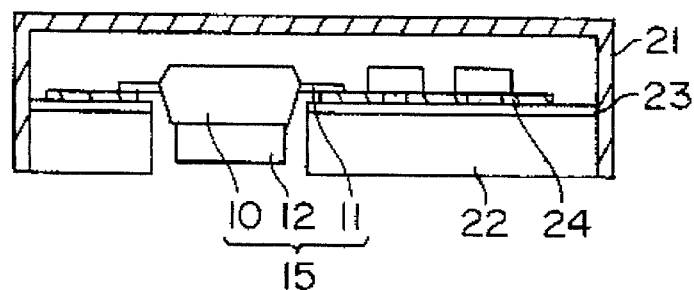
FIG. 7 is a cross-section of conventional semiconductor laser device which is another embodiment of the invention.

Although printed circuit board 16 lined with metal film 19 is employed in this embodiment of the invention, the same effect should be obtained by employing a multi-layered printed circuit board within which metal film 19 is disposed. The same effect can also be obtained by using a metal-based printed circuit of which substrate is metal sheet 22 and electric circuit 24 is printed on insulating layer 23 as shown in FIG. 7.

Figure 8:
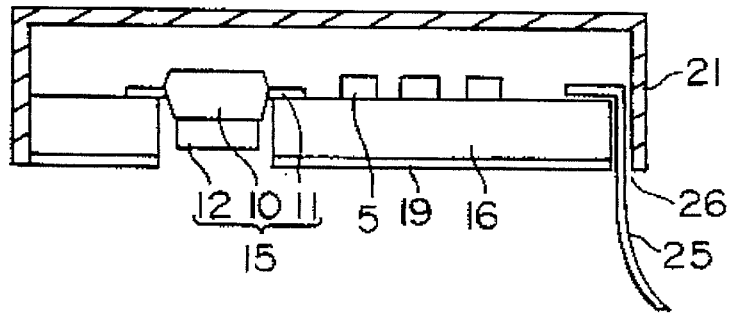
FIG. 8 is a cross-section of semiconductor laser device which is another embodiment of the invention, showing a method to lead out its electrodes.
Figure 9:
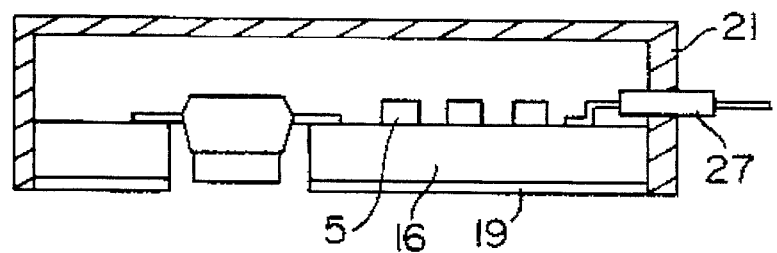
FIG. 9 is a cross-section of semiconductor laser device which is another embodiment of the invention, showing another method to lead out its electrodes.

Since the high-frequency signals are processed within the printed circuit board, the electrical connection between the circuit disposed on the printed circuit board and the external electronic circuit can be easily accomplished without producing high-frequency signal interference. For example, flexible printed circuit board 25 connected to printed circuit board 16 can be lead-out through gap 26 provided between metal cover 21 and printed circuit board 16 as shown in FIG. 8. Moreover, if high-frequency signal leakage from flexible printed circuit board could be a problem, the electrodes can be externally lead-out by using through-capacitors 27 disposed to pass through metal cover 21 as shown in FIG. 9.

Although the above-shown embodiment of the invention shows a case where only a high-frequency oscillator circuit is disposed on printed circuit board 16, an improved semiconductor laser device can be obtained by disposing any one of the circuits including a circuit to apply high-frequency signal to semiconductor laser chip, circuit to control the output optical intensity of semiconductor laser element, and a circuit to transform/amplify/process the signal current/ voltage derived from the photo-detector disposed within optical unit 15.

Furthermore, although this embodiment of the invention shows a case where the outgoing semiconductor laser light is reflected vertically to the silicon substrate by a mirror having an inclination angle of 45° provided within the optical unit, the same effect can be obtained by using a surface emission type semiconductor laser chip emitting the laser light vertically when the chip is mounted on a comb-frame. In a case where an edge-emission type semiconductor laser device is used, a similar effect can be obtained by mounting the semiconductor laser chip on a metal block by which the outgoing light is reflected vertically, and mounting on a comb-frame.

We claim:

1. A semiconductor laser device comprising:

a semiconductor laser chip mounted directly or indirectly through a semiconductor substrate on a comb-frame and provided with an outer frame made of an insulation material disposed on an area surrounding said comb-frame on which said semiconductor laser chip is mounted and fixed on a printed circuit board provided with a through-hole allowing a direct pass of laser light emitted from said semiconductor laser device, a high-frequency signal circuit, and a metal film layer on a rear surface of said printed circuit board or within said printed circuit board.

2. A semiconductor laser device according to claim 1, wherein said semiconductor substrate is provided with a mirror having a surface inclined at an angle of 45° in order to reflect the laser light emitted from said semiconductor laser device vertically to said semiconductor substrate.

3. A semiconductor laser device according to claim 1, wherein either a photo-detector or an electric circuit is provided on said semiconductor substrate.

4. A semiconductor laser device according to claim 2, wherein either a photo-detector or an electric circuit is provided on said semiconductor substrate.

5. A semiconductor laser device according to claim 1, 2, 3 or 4, wherein at least one circuit selected from the group consisting of a circuit to apply a high-frequency signal to said semiconductor laser device, a circuit to process the output signal of said photo-detector disposed on said semiconductor laser and a circuit to protect said semiconductor substrate against electric surge is provided.

* * * * *